(12) United States Patent
Tarabbia et al.

(10) Patent No.: US 7,157,342 B1
(45) Date of Patent: Jan. 2, 2007

(54) THYRISTOR-BASED SEMICONDUCTOR MEMORY DEVICE AND ITS METHOD OF MANUFACTURE

(75) Inventors: Marc Tarabbia, Austin, TX (US); Scott Robins, San Jose, CA (US)

(73) Assignee: T-RAM Semiconductor, Inc, Milpitas, CA (US)

( * ) Notice: Subject to any disclaimer, the term of this patent is extended or adjusted under 35 U.S.C. 154(b) by 72 days.

(21) Appl. No.: 11/026,400

(22) Filed: Dec. 29, 2004

(51) Int. Cl.
*H01L 21/336* (2006.01)
(52) U.S. Cl. .................. 438/303; 438/197; 257/107
(58) Field of Classification Search ........... 438/197, 438/303, 311, 350, 585, 592; 257/107, 126, 257/130, 133
See application file for complete search history.

(56) References Cited

U.S. PATENT DOCUMENTS 5,541,121 A   7/1996  Johnson 6,888,176 B1 *  5/2005  Horch et al. ............... 257/107

OTHER PUBLICATIONS

Chih Hsin Wang and Jan Van Der Velden, A Single-Poly BiCMOS Technology with 30 GHz Bipolar FT; 1994 Bipolar/BiCMOS Circuits & Technology Meeting; 1994 IEEE; pp. 234-237.

* cited by examiner

*Primary Examiner*—Phuc T. Dang
(74) *Attorney, Agent, or Firm*—Fields IP, PS

(57) ABSTRACT

A thyristor-based memory device may comprise a commonly-implanted base region, in which a common emitter region may be implanted for the left and the right thyristors in a mirror-image pair. The implanting of the base region may include directing the dopant toward a semiconductor material through a window defined by sidewalls formed in a conditioned masking material over the semiconductor material. The resulting base and emitter regions may be substantially symmetrical about a central boundary plane. In relation to the symmetry, one thyristor may be operable with a minimum holding current within about 10 percent of that for the other thyristor in the mirror-image pair.

35 Claims, 12 Drawing Sheets

THYRISTOR-BASED SEMICONDUCTOR MEMORY DEVICE AND ITS METHOD OF MANUFACTURE

BACKGROUND

The present disclosure is directed to semiconductor devices and, more specifically, to methods of producing thyristor-based memory that may include thyristors of substantially uniform characteristics across an array.

With the progression of semiconductor technology, semiconductor devices of ever-decreasing geometry have been realized for enabling the fabrication of integrated circuits of increased density and complexity. While this industry, in general, may be understood to address a variety of different types of circuits; the design, construction and manufacture of semiconductor memory devices—which may be used for storage of digital data—has conventionally been of particular interest to particular segments of the industry.

Most semiconductor memory devices may be described as static random access memory (SRAM) or dynamic random access memory (DRAM). SRAM's, conventionally, have been used for applications requiring quick performance and responsiveness.

In contrast, DRAM's typically have been associated with applications of reduced speed requirements. These DRAM's, although of responsiveness slower than conventional SRAM's, might still have found favor by way of their density advantage—i.e., area per bit.

More recently, however, thyristors have been introduced as a type of Negative Differential Resistance (NDR) SRAM device that may offer both speed potential as well as density. Additionally, some of the more recent thyristor-based memory may be capable of realization via readily available CMOS processes, procedures and equipment.

One consideration associated with design of thyristor-based memory concerns the magnitude of a thyristor's holding current—i.e., the current necessary for the device to preserve a conductive state (on-state). If such thyristor is operable with a low holding current, low power dissipation may be achieved during the overall operation of the memory device. However, these minimum current levels may depend on the desired reliability (e.g., maximum tolerable error density) and noise immunity.

The noise immunity of a thyristor-based memory cell may be related to its blocking characteristics. If the gain of the thyristor is too great, then the threshold level of the thyristor's blocking state may drop to a level that may hinder data preservation. An excessive gain may cause the thyristor to be vulnerable to noise influences, wherein the noise may erroneously trigger the thyristor from a non-conductive state to a conductive state. For similar reasons, it may be difficult to transition a thyristor of excessive gain from a conductive state to a non-conductive state.

Accordingly, a compromise may be evident when designing a gain for the constituent bipolar devices of the thyristor element of a thyristor-based memory. The selection of a gain too low for the bipolar devices of the thyristor may hinder the ability to write and preserve data of a first type (conductive state) within the thyristor. On the other hand, the selection of a gain too great may, alternatively, hinder the ability to write and preserve data of second type (non-conductive state). Because of these apparent trade-offs, a great deal of effort may focus on designing the thyristor for a bipolar gain that may permit reliable writing and storage of either of first-type or second-type data; and, yet, still being capable of reliable fabrication over given variances that may affect the gain. This effort may be further influenced by the ability to fabricate memory elements consistently across the memory array.

Various environmental conditions such as temperature may be understood to influence the performance of semiconductor devices. Additionally, during manufacture of thyristor-based semiconductor memory, various processes—e.g., doping, implant, activation, anneal procedures, and the like—may include tolerance levels or limitations that may contribute to device variations; and, likewise, the reliability of the thyristor-based memory to handle data with immunity to noise, environmental influences and temperature variation. The ability to consistently produce accurate geometric of the thyristors across the memory array, in particular, those parameters that may impact its on/off characteristics, can have a significant influence on manufacturing yields and overall device reliability.

SUMMARY

In accordance with an embodiment of the present invention, a method of fabricating a semiconductor may comprise forming sidewalls in masking material over semiconductor material to define a window and expose a select region of the semiconductor material. After forming the masking material with the sidewalls defining the window, it may be conditioned for improving its durability to ion bombardment as might be used during the implant of base and emitter regions to the thyristor devices. A first-type dopant may then be implanted into the semiconductor material for defining a commonly implanted base region with opposite lateral ends to be for different ones of first and second thyristors for a mirror-image pair. The implanting with first-type dopant may affect an extent for the commonly implanted base region that may be defined relative to the sidewalls of the mask's window. A second-type dopant may then be implanted into regions of the semiconductor material that are aligned to the sidewalls of the masked window. The implanting of the second-type dopant may form an emitter region for the thyristors of the mirror-image pair, having a lateral extent less than that defined to the commonly implanted base region and substantially symmetrically therein.

In a particular further embodiment, the implanting of first-type dopant for the base regions may include directing the first-type dopant toward the semiconductor material per an acute angle of incidence of up to 60 degrees as defined relative to a plane parallel to a surface of the semiconductor material. The implanting of the second-type dopant for the emitter region may comprise directing the second-type dopant toward the semiconductor material with an angle of incidence between ±4 to ±15 degrees relative to a normal axis perpendicular to the plane defined by the surface of the substrate material.

In a further embodiment, the masking material may be formed by layering and patterning photoresist over the semiconductor material so as to define an opening with a periphery to outline the common emitter region for the left and right thyristors of the mirror-image pair. After forming the opening, the photoresist may be conditioned in a temperature environment of at least 90 degrees Celsius and up to 250 degrees Celsius. The conditioning may last a duration of at least 10 seconds and, in some embodiments, up to 2 minutes. After conditioning the masking material over the semiconductor substrate, the implants for the base region and emitter regions may be performed.

In a further embodiment of the present invention, a method of fabricating a thyristor-based semiconductor memory device may comprise forming masking material over semiconductor material with a window outlining a portion of the semiconductor material for a commonly implanted base region to left and right thyristors of the mirror-image pair. After implanting first-type dopant to form a commonly implanted base region to the left and right thyristors, the sidewalls of the masking material may then be modified to narrow the width between the left and right sidewalls of the mask's window. After narrowing the width of the window defined by the masking material, second-type dopant may then be implanted for a common emitter region in the semiconductor material.

BRIEF DESCRIPTION OF DRAWINGS

The subject matter of embodiments of the present invention may be understood by reference to the following detailed description, and with reference to the accompanying drawings, in which.

DESCRIPTION OF EMBODIMENTS

Figure 1:
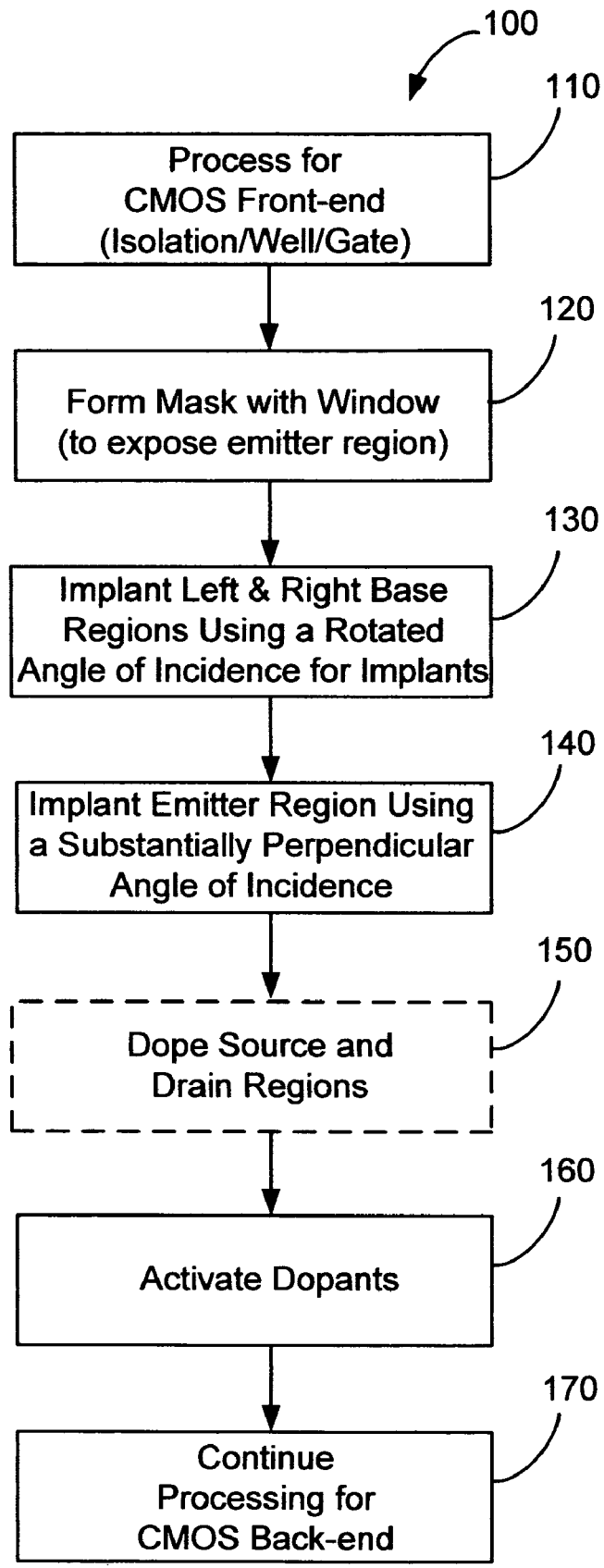
FIG. 1 is a simplified process flow diagram associated with forming a thyristor-based semiconductor memory device comprising two mirror-image thyristors and access devices, as may be useful for gaining an understanding of certain embodiments of the invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

In the description that follows, readily established circuits and procedures for the exemplary embodiments may be disclosed in simplified form (e.g., simplified block diagrams and/or simplified description) to avoid obscuring an understanding of the embodiments with excess detail and where persons of ordinary skill in this art can readily understand their structure and formation by way of the drawings and disclosure. For the same reason, identical components may be given the same reference numerals, regardless of whether they are shown in different embodiments of the invention.

As used herein, "substrate" or substrate assembly may be meant to include, e.g., a portion of a semiconductor or bulk material. Such portion may have one or more interfacing layers of material including, but not limited to Si, Ge, silicon germanium, and all other semiconductors that have been formed on or within the substrate. Layered semiconductors comprising the same or different semiconducting material such as Si/Si, Si/SiGe and SOI (silicon on insulator) may also be included. These layers and/or additional layers may be patterned and/or may comprise dopants to produce devices (e.g., thyristors, transistors, capacitors, interconnects, etc.) for an integration of circuitry. In forming these devices, one or more of the layers may comprise topographies of various heights. When referencing this integration of circuitry, therefore, it may be described as integrated together, on or with a substrate.

As referenced herein, portions of a semiconductor (e.g., a transistor or thyristor) may be described as being formed in, at or on a semiconductor substrate. Such alternative terms in/at/on may be used individually merely for purposes of convenience. In the context of forming semiconductors, such terms may collectively reference portions of a semiconductor element that may be within and/or on a starting structure or material.

As used herein, the term "surface" may refer to the surface of an embedded layer or sheet of material. The "surface" may have one or more layers of materials bonded to it. Surface, depending on context, may not necessarily be a surface exposed only to air or other non-semiconductor materials. The term surface might, therefore, be used merely for purposes of clarity or convenience to describe layering of materials against each other (e.g., on the surface of the layer below the referenced layer). Nor is a "surface" or "upper surface" necessarily a "top surface" of a structure or device comprising a plurality of layers of materials. For example, a substrate "surface" may interface with a layer of oxide, nitride, strained silicon, etc. Such surface might, therefore, be used simply to establish a frame of reference for spatial relationships (e.g., vertical, horizontal, etc.).

As used herein, the terms "interface", "boundary", "border", "junction" or "extent" may, depending on context, be alternative terms and may be used individually merely for the purpose of convenience. For example, in discussing the junction of two layers, materials or structures, reference may be made to an "interface", "boundary", or "border". Depending on the context, the term "bond" may also refer to an "interface", "boundary", "border", or "junction".

In some embodiments of the present invention, a semiconductor device may comprise an array of thyristor-based memory cells, which may comprise at least in part two mirror-image thyristors interfaced by operable access devices and other peripheral logic devices in a semiconductor substrate, e.g., a wafer. In a particular embodiment, the two mirror-image thyristors may share an emitter in common, which may be disposed symmetrically and in overlapping relationship within a commonly implanted base region. For purposes of the disclosure made herein, it may be understood that certain terms may be interchanged for alternative embodiments of particular context and, depending on the polarity or other operating characteristics as may be understood to those of ordinary skill in this art; for example, an emitter can be anode or cathode for the thyristor depending on the polarity in question. Further, the commonly implanted base region may be associated with the base regions (n-base) of the left and the right thyristors proximate the common emitter region (e.g., anode-emitter).

Figure 2:
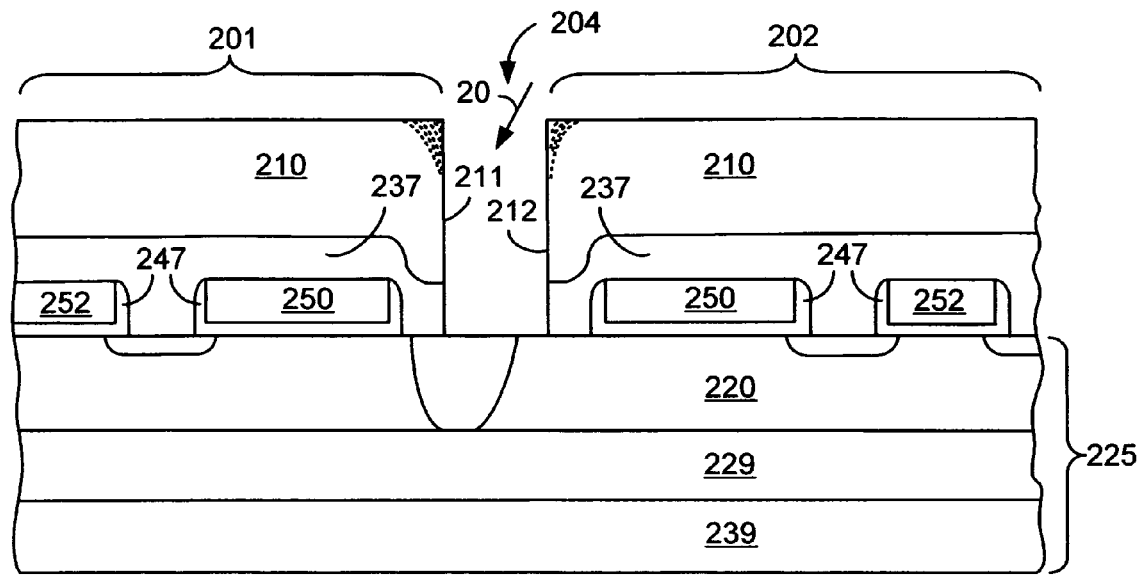
FIG. 2 is a simplified cross-sectional view of a semiconductor substrate during a stage of fabricating a the thyristor-based device comprising two mirror-image thyristors, showing formation of first portion of a base region for one of two mirror-image thyristors by an acute angle through a window defined by sidewalls in a photoresist mask and also showing one of the sidewalls of the mask being damaged by this first portion of the angled implant.

Referencing FIGS. 1 and 2, a typical method 100 of fabricating a thyristor-based semiconductor memory device may comprise performing preliminary CMOS front-end procedures (block 110 of FIG. 1) such as forming semiconductor material over a substrate for an SOI structure 225 and may also include forming isolation trenches around different active regions, and/or the formation of first wordlines for gate electrodes 252 to access devices and second wordline electrodes 250 to be capacitively coupled to a base region for respective thyristors. It may be understood that the front-end procedures may also include forming gate electrodes over the substrate for other logic devices such as those of a periphery to the memory, e.g., read/write controllers, address controllers, multiplexers, sense amplifiers and/or other interfacing or integrated logic devices.

Moving forward with further reference to FIGS. 1–2, the typical method 100 for the formation of left and right thyristors to a mirror-image pair for respective memory device regions 201, 202, may then begin with layering and patterning (block 120 of FIG. 1) of photoresist 210 over the surface of substrate 225 including regions 201, 202 for memory devices. The photoresist may be patterned to protect regions for the thyristor that may include second wordline electrodes 250 and also to protect regions for the access device that may include first wordline electrodes 252. The patterning may form sidewalls 211, 212 in photoresist 210 for defining window 204 with an outline around a common emitter region to be associated with the common emitter for left and right thyristors of the mirror-image pair.

Figure 3:
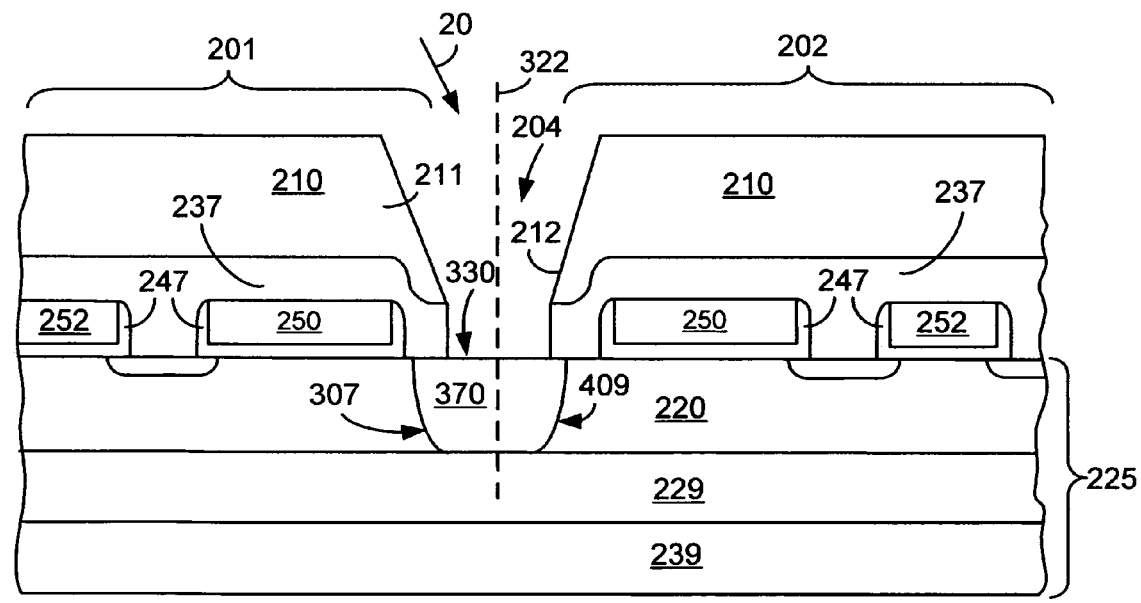
FIG. 3 is a simplified cross-sectional view of the semiconductor substrate of FIG. 2 in a further stage of fabrication, showing formation of another portion of the base region by the angled implant and aligned relative to an opposite wall of now asymmetric sidewalls defining the mask's window.
Figure 4:
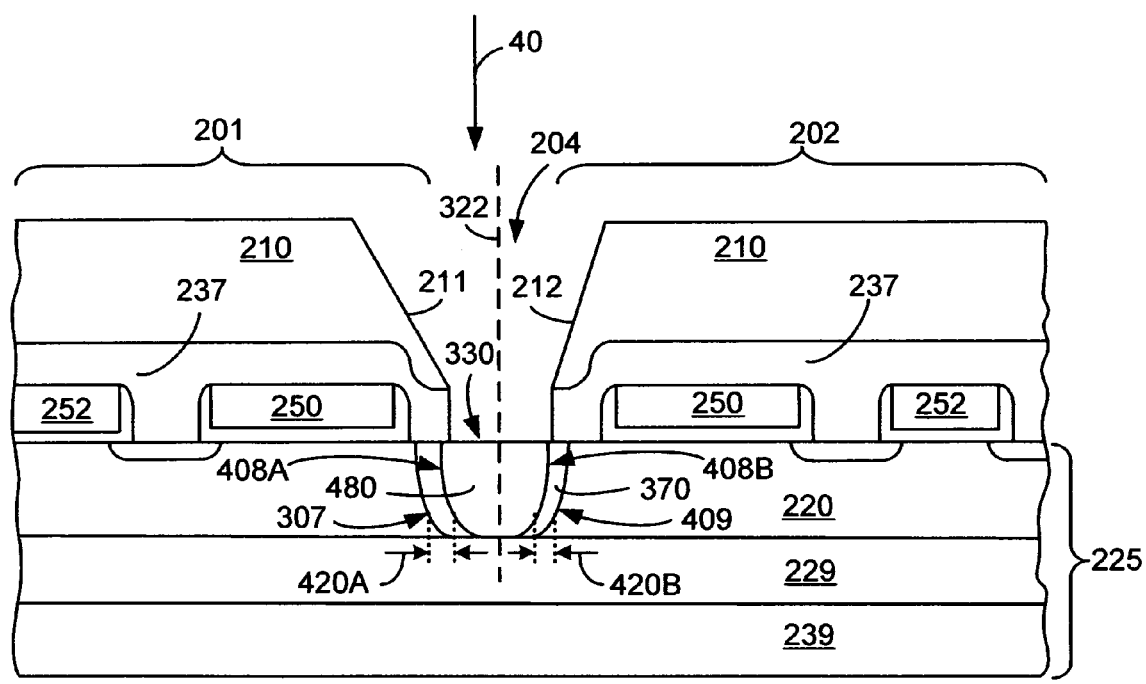
FIG. 4 is a simplified cross-sectional view of the thyristor-based device of FIG. 3, showing a second region (e.g. a common emitter) being implanted through the window of asymmetric sidewalls.

Referencing FIGS. 3 and 4, commonly implanted base region 370 may be formed by implanting (block 130 of FIG. 1) a given dopant 20 with an acute angle of incidence relative to surface 330 of silicon 220. During a first portion of the angled implant, a first region for commonly implanted base region 370 may be defined. During a second portion of the angled implant, using the same angle of incidence but after rotating the wafer (or the implanter) approximately 180 degrees about an axis 322 substantially normal to surface 330, the second region may be formed for the commonly implanted base region 370.

Further referencing FIGS. 2 and 3, it may be noted that during the first portion of the angled implanting of dopant 20, sidewalls 211, 212 of photoresist 210 may be impacted and deformed (as illustrated by the shaded regions in FIG. 2). It may be theorized that the left sidewall 211 of the masking material may receive a greater degree of deformation during the first portion of the implant, than what the right sidewall receives. This, in turn, may alter symmetry of the overall photoresist mask 210 as illustrated by way of example in FIG. 2. In other words, it may be theorized the incident ions during the first portion of the implant (20 of FIG. 2) may damage the left sidewall 211 to a greater extent than the right 212 due at least in part to the more direct angle of incidence by which the ions may strike the exposed left sidewall. Therefore, the left sidewall may end up with a greater slope or recession relative to the photoresist of the right sidewall (see FIG. 3). Further, the first portion of the angled implant may also be theorized to harden the mask such that the subsequent (second) portion of the angled implant may not impart similar changes to the right sidewall of the mask window.

Further referencing FIG. 3, because of the now asymmetric photoresist mask, the second portion of the angled implant for the commonly implanted base region 370 of the typical process may not form the opposite lateral extents to the base region symmetrically. The extents resulting from the different implants may therefore be understood to depend upon the available profiles of the photoresist 210 as defined by the respective left and right sidewalls 211, 212. It may now be theorized by this disclosure that the different sidewall slopes caused by the changing photoresist 210 may cause one region of the mirror-image pair to be formed with a greater lateral extend than the other. For example, lateral extent 307 for the first region of the commonly implanted base region for the left device may encroach further laterally toward its electrode 250 than that for the right device. This may cause the left device to be more vulnerable to induced leakage in the junction between its separate base regions. The increased leakage for the left may thus induce inconsistent operating characteristics between the two different left and right devices of the mirror-image pair and, thus, it may adversely impact their overall performance and/or reliability within the memory array.

Moving forward with reference to FIG. 4, dopant 40 of type opposite to the base region dopant 20 may be directed toward surface 330—i.e., using an angle of ±15 degrees relative to the central boundary plane 322 to form common emitter region 410 to each of the left and right thyristors (block 140 of FIG. 1). The lateral distribution of dopant 40 may define emitter region 480 with outmost left-to-right lateral extents 408A, 408B aligned dependent on the placement and profiles of left and right sidewalls 211, 212 of the mask window. Additionally, the lateral extents to the emitter region 408A, 408B may span a width less than that for the commonly implanted base region 370. A width 420A of the base region (e.g., an N-base) for the left device, thus, may be defined by the amount by which left extent 307 of the first implant extends beyond the left extent 408A for the emitter implant. Likewise, a width 420B for the base region for the right device may be defined by the amount by which the right extent 409 from the first implant extends beyond the right extent 408B for the emitter region. However, by this typical process 100, therefore, the placement and magnitude of the width 408A of the base for the left may differ from that for the right thyristor, as may be related to the difference in the masking characteristics effected by the left to right implants. Such resulting asymmetry may adversely influence the overall performance and/or incorporation of thyristor devices 201, 202 within a memory array.

In accordance with an embodiment of the present invention, referencing FIG. 5 and FIGS. 6–9, a method of semiconductor fabrication 500 may enable formation of left and right thyristors to a mirror-image pair for a semiconductor memory array with substantially symmetrical relationship. Initially, substrate 225 may be processed (block 510 of FIG. 5) to establish, e.g., a starting structure for a silicon-on-insulator (SOI) configuration. For example, silicon layer 220 may be formed over a buried oxide (BOX) 229, which in turn may be supported by a supporting substrate 239, such as silicon.

Other preliminary procedures of the CMOS front end (block 510 of FIG. 5) may include the formation of isolation structures between different active regions in silicon layer 220 of SOI structure 225. First wordline electrodes 252 may also be formed over body regions for access devices to be operable for enabling selective access of thyristors, and second wordline electrodes 250 may be formed to be capacitively coupled to a given base for the thyristors. Each of the electrode formations, e.g., of the first and second wordline electrodes, may be understood to include formation of dielectric (e.g., oxide, nitride, etc.) between the electrodes and the semiconductor material (i.e., silicon 220). In some embodiments, the thickness and/or dielectric constant of the dielectric for insulating second wordline electrode 250 from silicon layer 220 may be greater than that for first wordline electrode 252. Returning with reference to FIGS. 2–4, a conformal layer of dielectric may be also deposited and subsequently etched away to form preliminary spacers 247 against the sidewalls of first and second wordline electrodes 250, 252.

Additionally, not shown specifically in FIGS. 6–9, gate electrodes may be formed over body regions to MOSFETS of other logic devices, e.g., logic devices of the periphery and/or CMOS logic for other systems in which the thyristor-based memory may be incorporated. Such logic devices could include, e.g., address decoders and multiplexers by which to select specific memory cells of the thyristor-based memory, sense amplifiers for determining data values of the memory cells, read/write buffers, and/or other computational or combinational logic to be integrated together with the thyristor-based memory.

After forming first and second wordline electrodes 250, 252 and other gate electrodes of other peripheral devices, lightly doped drain/source (LDD) extension regions may be formed for the different CMOS devices, as may be known to those of ordinary skill in the art. Such LDD extension and/or halo implants may be incorporated as a part of the preliminary front-end CMOS processes (block 510 of FIG. 5).

Figure 5:
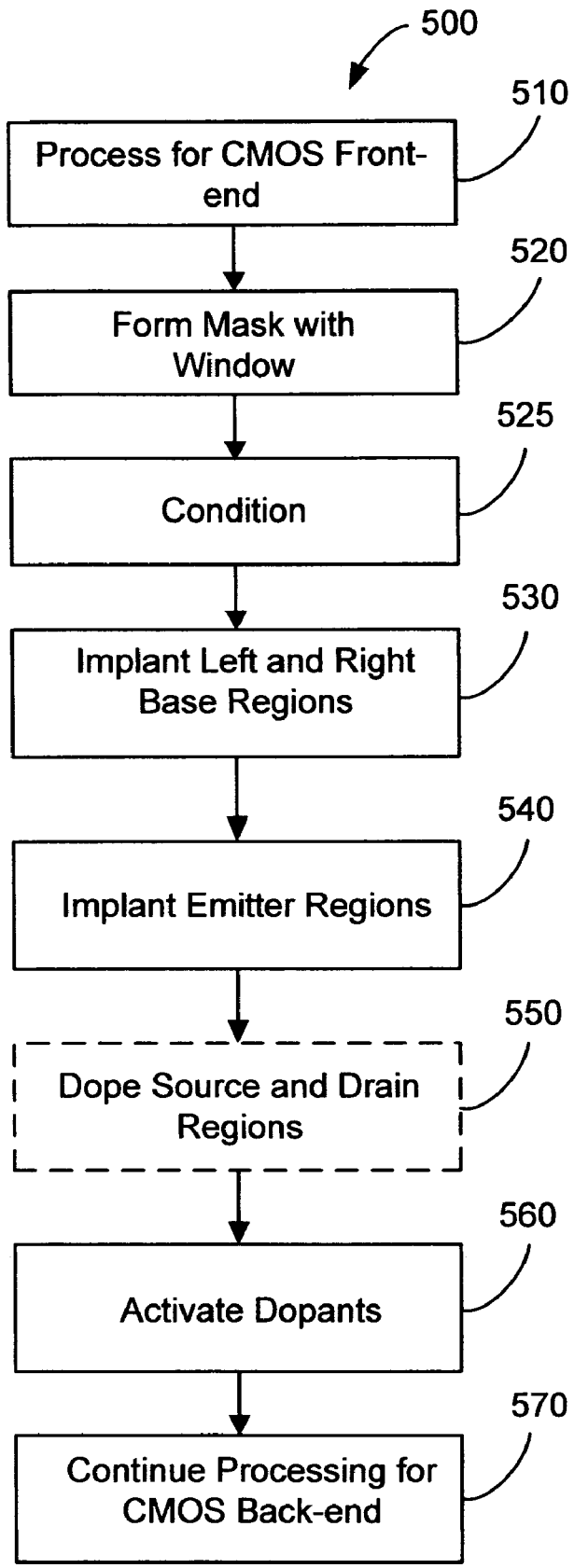
FIG. 5 is a simplified process flow diagram for a novel method of forming a thyristor-based device comprising two mirror-image thyristors and peripheral devices, consistent with some embodiments of the present invention in which a mask may be preconditioned before base and emitter region implants.
Figure 6:
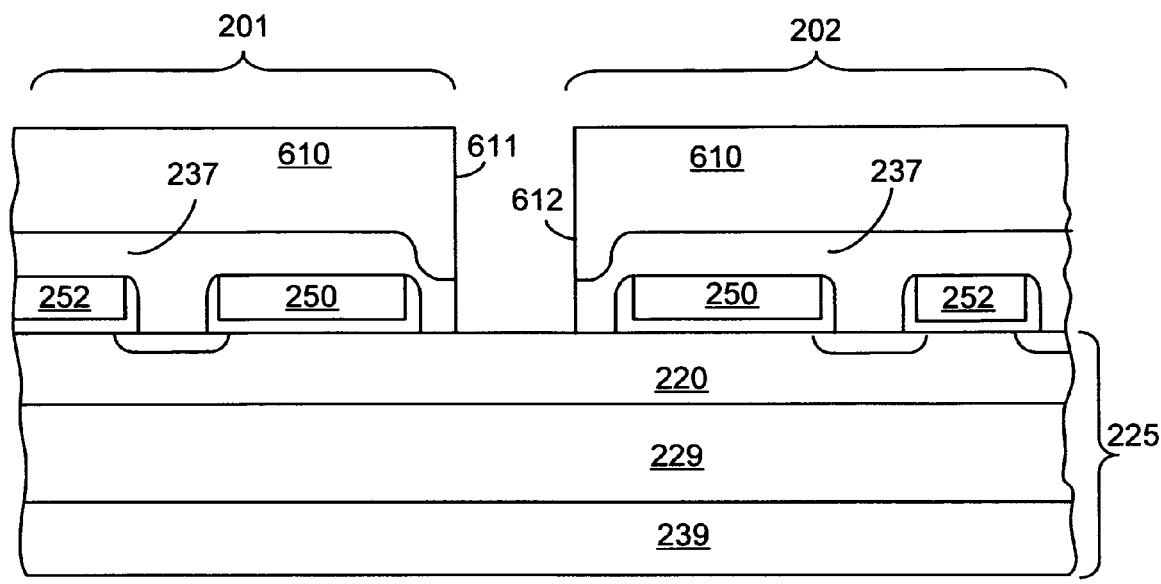
FIG. 6 is a simplified cross-sectional view of a semiconductor substrate during a stage of fabricating a thyristor-based memory device comprising two thyristors of a mirror-image pair, showing conditioned photoresist with a window defined by sidewalls, consistent with some embodiments of the present invention.

Continuing with further reference to FIGS. 5 and 6, dielectric 237 may be layered conformally over SOI substrate 225 including regions with first and second wordline electrodes 250, 252. In one embodiment, the dielectric may comprise nitride or multilayered and may be layered with a thickness of about 20 to 200 nm. Photoresist 610 may then be layered and patterned over the conformally deposited dielectric 237. The patterning may form sidewalls 611, 612 to define a window by which to expose select regions of dielectric 237. In one embodiment, photoresist 610 may be formed with a thickness of about 0.1 to 1 μm. In yet further embodiments, photoresist 610 may comprise, for example, 436-nanometer (g-line), 365-nanometer (i-line) or other 248-nanometer, 193-nanometer or 157-nanometer operable masking materials.

If formed with about 0.1 to 1 μm thickness, sidewalls 611, 612 may be formed to define a width to the window sufficient to avoid complete sidewall shadowing (i.e., by the masking material of dielectric and optionally the photoresist as well) during the angled implant to be used during the formation of the left and right base regions. For example, the width may be defined to be about 0.2 to 1 µm, dependent on the thickness of the dielectric and photoresist.

Further referencing FIGS. 5–6, after forming sidewalls 611, 612 to define a width for the window through photoresist 610, regions of the dielectric exposed by the window may be removed so as to extend (block 520 of FIG. 5) the sidewalls and depth of the window. The portions of dielectric removed may be aligned relative to sidewalls 611, 612 previously defined in the photoresist. In a particular embodiment, the dielectric may be removed by an anisotropic etch, which might also comprise a chemistry selective for the removal of the dielectric material more favorably relative to silicon 220 thereunder.

The etch may form a shoulder to dielectric 237 adjacent and extending laterally outward from the neighboring second wordline electrodes 250 toward the anode-emitter region. In one embodiment, the lateral extent of the shoulder may comprise a distance greater than its conformal thickness. In a further embodiment, it may comprise a distance sufficient to form an N-base region (e.g., lateral width of up to about 100 nm) therebelow and with a lateral offset relative to a peripheral wall or edge of second electrodes 250.

In this particular embodiment, the sidewalls of the masking material may define a window with an outline to expose (block 520 of FIG. 5) a region of the silicon layer to be associated with forming a common emitter region 880. The exposed common emitter region may be disposed laterally and substantially symmetrically between neighboring second wordline electrodes 250 associated with the left and right thyristors respectively for the mirror-image pair.

After defining the window, further referencing FIGS. 5–6, the masked substrate may be conditioned (block 525 of FIG. 5). In this embodiment, the patterned photoresist is conditioned before the implanting of base or emitter dopants and will be made to be more durable so as to withstand ion bombardments during the implants.

In one method, the conditioning may be performed before the dielectric etch. In other alternative embodiments, the conditioning may be performed after the etching of the dielectric associated with defining or extending the window therethrough. It may be theorized that by conditioning the masking material after etching the dielectric, the sidewalls in the dielectric may be defined more sharply (that is with a more vertical profile) than what might otherwise result if the photoresist were conditioned before the etching of the dielectric.

In a particular embodiment, the conditioning of the masking material may comprise baking the patterned photoresist 610 in an annealing environment. Where the photoresist is exposed to a UV process, it may be conditioned by exposure to a temperature environment of between about 90 degrees to about 170 degrees Celsius. The duration of this photoresist conditioning may last approximately 10 seconds or longer, and in some embodiments up to two minutes.

Consistent with another embodiment, the photoresist conditioning may use a temperature of up to 250 degrees Celsius.

It may be theorized that the conditioning anneal may promote regrowth of continuous amorphous layers to be extended to the surface of masking material 610. The conditioning bakes may also cure some of the crystalline defects in the regions beyond the amorphous layer of photoresist 610. Further, the conditioning may strengthen sidewalls 611, 612 that define window 204 in the masking material and may make them more durable to subsequent dopant bombardment.

In another embodiment, conditioning 525 may also comprise bombarding the masked substrate with a neutral species, which may include bombarding photoresist 610 over regions of dielectric 237 after forming sidewalls 611, 612 in the masking material. The neutral species may also bombard exposed regions of the dielectric and silicon layer as defined by the window. For some embodiments, the neutral species used during the bombardments may comprise an element selected from the group consisting of carbon, silicon, germanium, hydrogen, halogen and noble gas (i.e., an element from the 1st, 4th, $7^{th}$ or 8th columns of the periodic table). The bombardment of neutral species into the masking material may be theorized to alter its atomic crystalline makeup and thus make its sidewalls 611, 612 more stable during subsequent dopant implants, as may be associated with forming base and common emitter regions for the two mirror-image thyristors.

Figure 7:
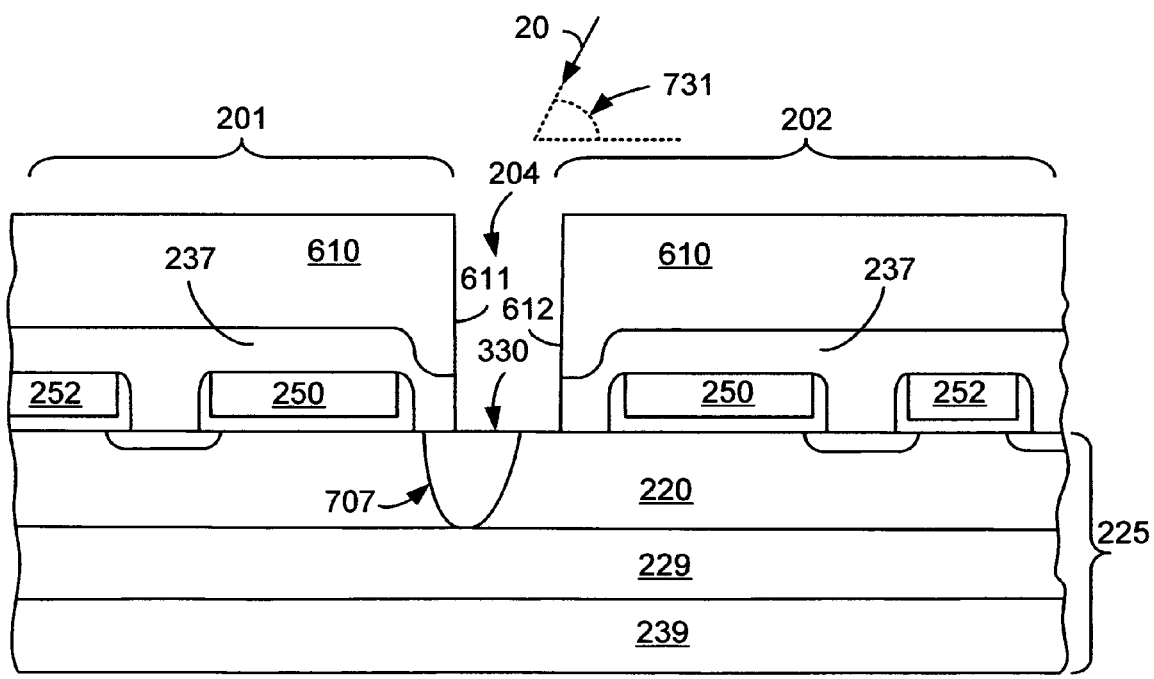
FIG. 7 is a simplified cross-sectional view of the semiconductor substrate of FIG. 6 during a further stage of fabricating a thyristor-based semiconductor memory device consistent with some embodiments of the present invention, showing a first portion of a common implant to base regions for left and right thyristors as may be aligned dependent on the sidewalls of the conditioned masking material.
Figure 8:
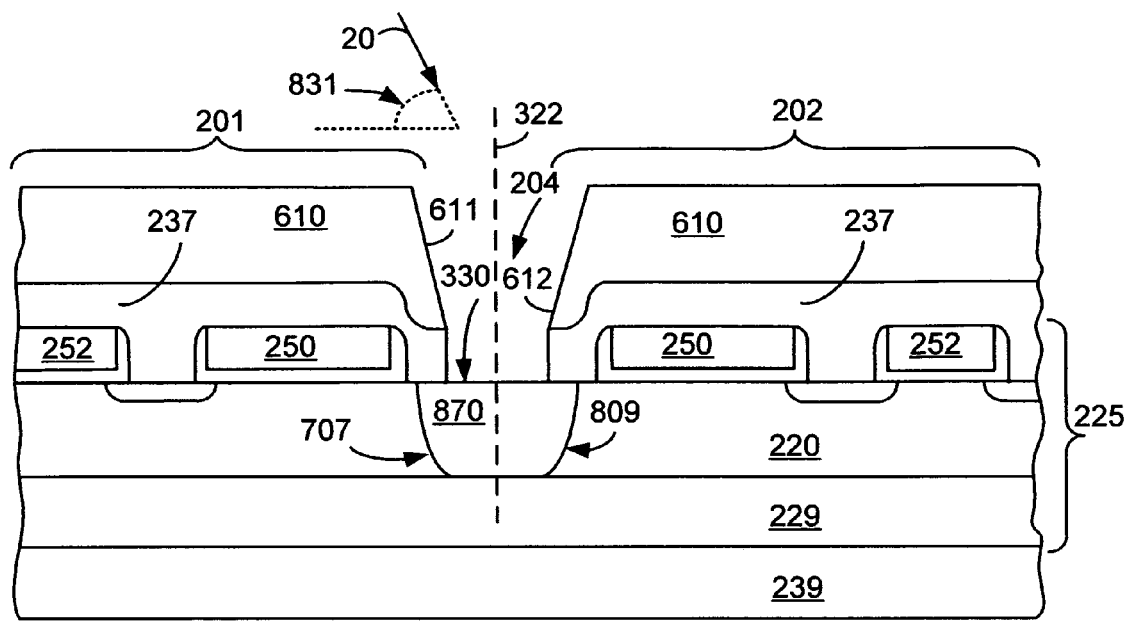
FIG. 8 is a simplified cross-sectional view of the semiconductor substrate of FIG. 7 during a further stage of fabricating a thyristor-based semiconductor memory device, showing a second portion of the common implant to the commonly implanted base region for the two mirror-image thyristors.

Referencing FIGS. 5 and 7–8, a first portion 707 of a commonly implanted base region 870 may be implanted (block 530 of FIG. 5) with dopant 20 of first conductivity type and using an acute angle of incidence 731 of between about 40 degrees to 65 degrees relative to a plane defined substantially parallel to surface 330 of the substrate. The first portion of the first-type dopant implant may reach a lateral extent 707 to define a left boundary for the commonly implanted base region disposed beneath and laterally beyond left sidewall 611 of the mask's window.

Prior to the second portion of the implant of dopant 20 to define a second portion of the commonly-implanted base region, in a particular embodiment referencing FIG. 8, the wafer with the masking material thereover may be rotated about 180 degrees around a rotational axis 322 substantially orthogonal to surface 330. The second portion of the implant of dopant 20 (block 530 of FIG. 5) may then form, therefor, a second region of the commonly implanted base region for the right device with a lateral extent to define a right boundary 808 to commonly implanted base region 870. This boundary may be located laterally beyond and beneath right sidewall 612 of window 204 in the masking material. As with the first portion of the base region implant, the direction of incidence for the dopant during the implant may also define the same acute angle 231B of incidence of between about 40 degrees to 65 degrees relative to the plane defined by surface 330 of substrate 225. Thus, the magnitude of lateral extent 808 resulting from the second portion of the first-type implant to define the right boundary of commonly-implanted base region 870 for the right thyristor of the mirror-image pair may be formed substantially equal to the leftward lateral extent 707 resulting from the first portion of the first-type implant for the base region for the left thyristor.

In one example, the implants for the formation (block 530 of FIG. 5) of the commonly implanted N-base region may use a species such as phosphorous, with an implant angel of about 60 degrees (relative to horizontal or 30 degrees relative to vertical), energy of about 60 keV, and dosage of about $4 \times 10^{14}$ atoms/cm$^2$, twisted. It will be understood that the specifics for the implant species, angle and energy in combination with the lateral extent of the implant mask may be selected with parameters sufficient to define the boundaries for the N-base region beneath the shoulders of dielectric 237 and laterally offset from capacitor electrode 250.

Figure 9:
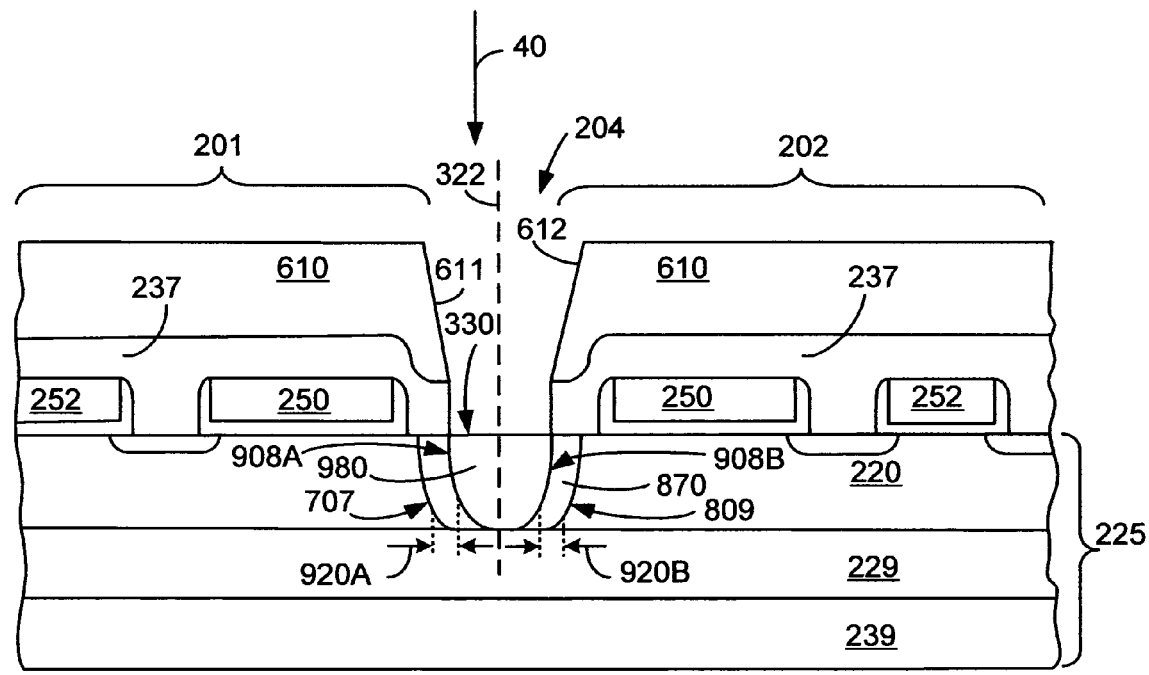
FIG. 9 is a simplified cross-sectional view of the semiconductor substrate of FIG. 8 during a further stage of fabricating the thyristor-based semiconductor memory device, consistent with some embodiments of the present invention, showing a common emitter region that may be implanted through the mask window.

Moving forward with further reference to FIGS. 5 and 9, dopant 40 of second conductivity type may be implanted (block 540 of FIG. 5) to form common emitter region to be shared by each of the left and right thyristors of the mirror-image pair. The ions of dopant 40 may be directed toward surface 330 with a direction of incidence of about 75 degrees to 105 degrees relative to a horizontal plane defined by surface 330 of semiconductor substrate 225 (or ±4 degrees to ±15 degrees from the normal). The second type dopant 40 may penetrate surface 330 of silicon to form common emitter region 980 with outmost extents 908A, 908B defined dependent on mask sidewalls 611, 612. In one embodiment, a species of boron may be used with an energy of about 9 keV, implant angle of about 4 degrees (relative to the vertical axis) and a dosage of at least $3 \times 10^{15}$ atoms/cm$^2$, twisted. Again, these levels are representative of simply one embodiment.

Thus, base region 920A of dopant 20 (e.g., an n-base region) for a left thyristor may be defined by the amount that the leftward lateral extent 707 of the commonly implanted base region 870 exceeds left lateral extent 920A for common emitter region 980. Likewise, base region 920B of dopant 20 for the right thyristor may be defined by the amount by which the rightward lateral extents differ. In some embodiments, base widths 920A, 920B for the right and left thyristors, respectively, may be about 50 nm to 200 nm with a difference therebetween of only as much as 10 percent.

Having implanted (block 540 of FIG. 5) common emitter region 980 for the left and right thyristors of the mirror-image pair, further referencing FIGS. 5 and 9, additional procedures 550, 560, 570 may be performed as may be associated with incorporating and/or integrating the thyristor devices with other logic devices. In one embodiment, the firstly patterned photoresist 610 used for forming the base and the emitter regions may be removed and new photoresist layered and patterned over the substrate to mask portions to be associated with the thyristor devices and to expose select regions of the substrate as will be associated with the N-MOS devices of logic devices, such as access transistor for accessing the thyristor devices, and/or N-MOS devices of other peripheral logic to further interface and/or incorporate the thyristor-based memory with other combinational logic.

With the new photoresist patterned for exposing region to be associated with the N-MOS devices, the anisotropic etch may be performed to form spacers from dielectric 237 (such as nitride) previously layered conformally over the silicon layer 220 and against the gate electrodes for the N-MOS devices disposed over associated body regions. The anisotropic etch may remove regions of the dielectric to expose regions of the silicon for the source and drain regions laterally outside the gate electrodes while defining spacers against the sidewalls of the gate electrodes. It may be noted that the spacers formed may be disposed against the sidewalls of electrodes and over regions of lightly doped extension regions (e.g., for lightly doped drain or LDD regions). It may be noted further that halo implants might also have been formed around the gate electrodes—between or proximate the extension region and body regions of the MOSFET devices. These extensions and halo implants may be understood, for some embodiments, to be formed before the conformal layering of dielectric 237 over and against gate electrodes.

After forming the spacers, returning with reference to FIG. 5, the formation (block 550 of FIG. 5) of source/drain region may comprise implanting N-type dopant to form deep-level source and drain regions for the MOSFET devices. In further embodiments, the N-type implant for the source and drain regions may also implant the source and drain regions for the logic devices of the periphery. In one example, the implant for the source/drain regions may use an energy and dosage to penetrate a full depth of the layer of silicon 220 of SOI substrate 225, e.g., an energy of about 40 keV and dosage of about $2 \times 10^{15}$ atoms/cm$^2$ when using arsenic.

In FIG. 5, the formation (phantom block 550) of source and drain regions on this embodiment is described as being performed after the implants 530, 540 for the base and emitter regions. In alternative embodiments, the formation (block 550) of the deep-level source and drain regions may be performed earlier in fabrication method 500. For such alternative embodiments, e.g., the deep-level source and drain implants may be performed as a part of the front-end CMOS processing (block 510) just after forming the gate electrodes of the CMOS devices, and after forming the lightly-doped drain (LDD) and halo implant regions.

In yet a further embodiment, the deep-level implants for the source and drain regions to P-MOSFET devices for CMOS logic devices of the periphery may be formed in-situ during the implant (block 540) for the emitter region (e.g., an anode-emitter) for the thyristor devices. Accordingly, photoresist mask 237 might be re-defined, or re-layered and patterned, after the angled implants for the base regions and before the emitter implant. The redefined mask may further include windows in other peripheral select regions so as to expose regions of the semiconductor device to be associated with P-MOS devices, e.g., as may be related to the CMOS logic of the periphery.

Figure 15:
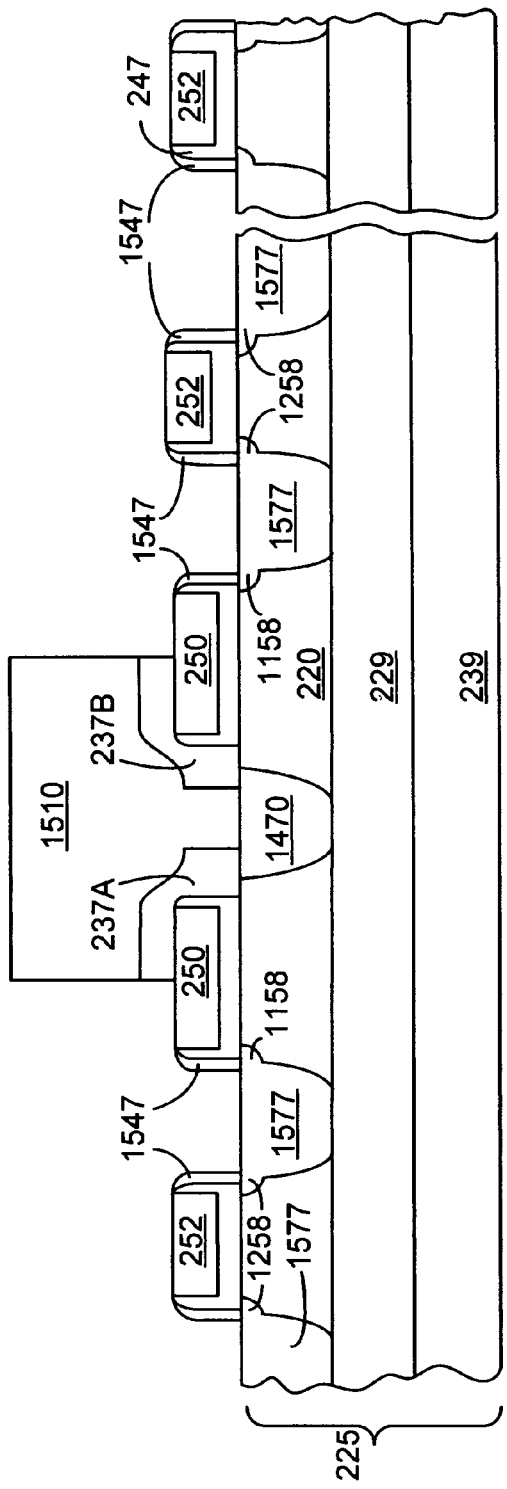
FIG. 15 is a simplified cross-sectional view of the semiconductor substrate of FIG. 14, during a further stage of fabricating a thyristor-based semiconductor memory device consistent with certain embodiments of the present invention, showing the formation of a new photoresist mask over the commonly implanted base region and formation of first new spacers to assist implanting source and drain regions for the access/peripheral devices.
Figure 16:
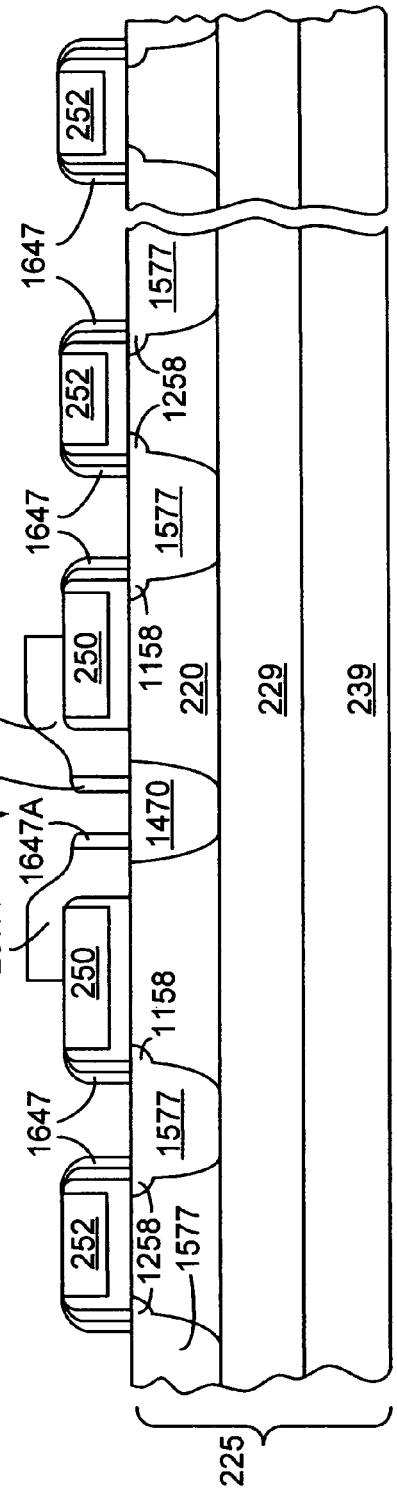
FIG. 16 is a simplified cross-sectional view of the semiconductor substrate of FIG. 15, during a further stage of fabricating a thyristor-based semiconductor memory device, showing the formation of new spacers against sidewalls of the dielectric to reduce the width of the window by which to expose the surface of the substrate.

Next, further referencing FIGS. 5 and 15, the deep-level source/drain implants, as well as those of the commonly implanted base and emitter regions, may be annealed as a part of activating (block 560 of FIG. 5) the dopants within the layer of silicon 220 of SOI substrate 225. In one embodiment, the activation anneal for the doped regions may use a temperature of between 600 degrees to 1200 degrees Celsius; and, in one embodiment, about 1050 degrees Celsius. The activation anneal may be performed for a duration of at least 5 seconds; in one embodiment, about 10 seconds, or in a spike anneal procedure less than about 5 seconds.

Further referencing FIG. 5, after performing the dopant activations, back end CMOS processing (block 570 of FIG. 5) may continue. For example, the photoresist may be removed for leaving patterned dielectric 237 as a mask. For this embodiment, the dielectric may serve as a silicide block. In some embodiments, the dielectric may comprise, e.g., nitride of a thickness greater than 30 nm. Metal such as tungsten, nickel, cobalt, platinum, titanium or other refractory metal may then be deposited over the dielectric masked substrates. A heat treatment may then diffuse metal of the deposited metal into select regions of the exposed regions of semiconductor material and also select regions of the electrodes. After diffusing the metal (siliciding) into the select regions of semiconductor material as defined by the dielectric mask, non-reacted portions of the metal may then be stripped. In a particular example, the residual metal may be stripped using an acid bath, leaving silicide on at least portions of the drain and source regions of MOSFET device, and silicide on at least portions of their respective electrodes.

Although they are not shown specifically, contacts and conductive lines may be formed over and integrated with the thyristor-based memory. For example, a reference voltage contact may be formed to contact an anode-emitter region of the thyristor. This contact may electrically link the common anode-emitter region to a conductive line that may be disposed (as part of a multi-level metal structure) over the semiconductor substrate and electrically operable to receive a bias voltage. Likewise, a bitline (not shown) may be disposed over the substrate as part of the metal layers or conductive lines for the semiconductor device and may be coupled to the source/drain region of an access transistor on a side thereof opposite the thyristor. This bitline may be electrically configured to transfer data signals between the thyristor cell and read/write circuitry of the memory.

Figure 10:
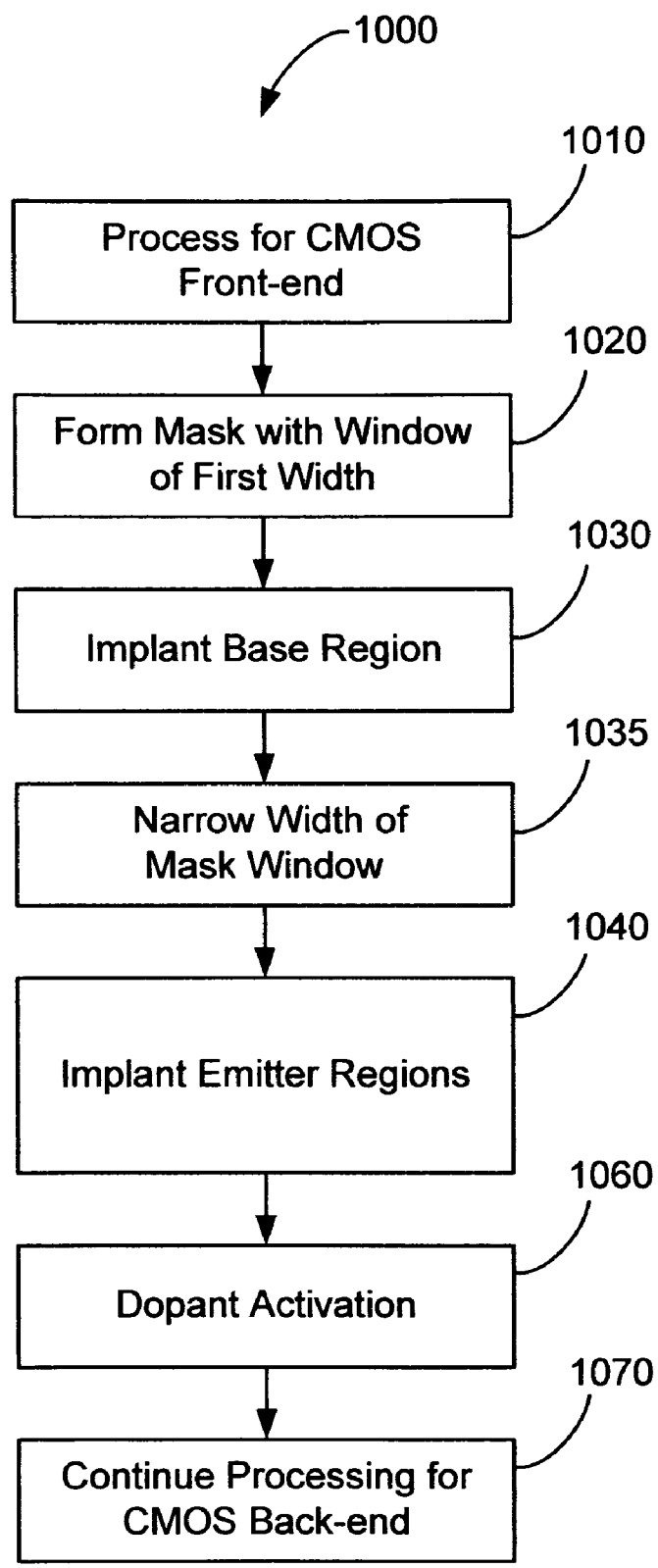
FIG. 10 is a simplified process flow diagram for another method of forming a thyristor-based semiconductor memory device comprising two mirror-image thyristors and peripheral devices, consistent with further embodiments of the present invention.
Figure 11:
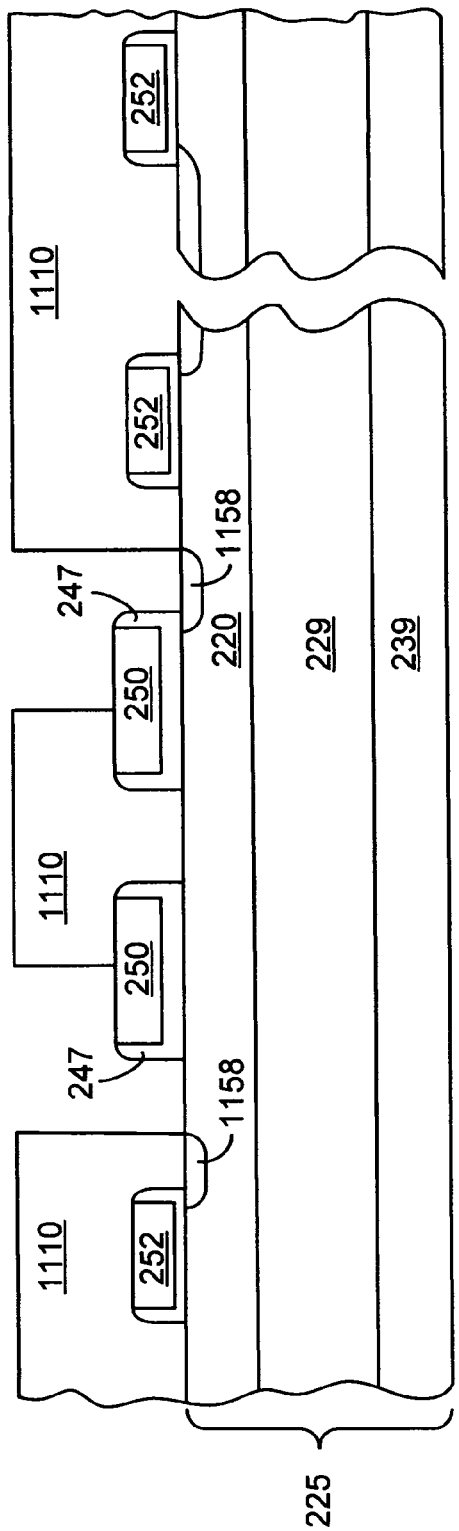
FIG. 11 is a simplified cross-sectional view of a semiconductor substrate during a stage of fabricating a thyristor-based semiconductor memory device comprising two mirror-image thyristors and peripheral devices, showing a first patterned photoresist to assist implanting certain emitter extension regions for the thyristors in mirror-image pair.
Figure 12:
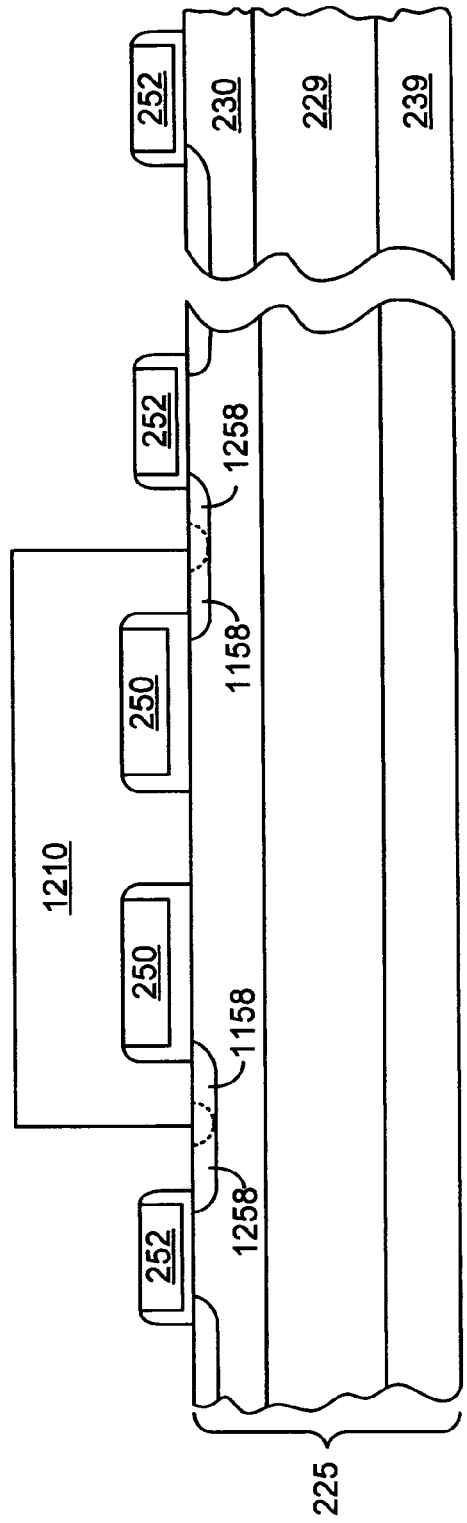
FIG. 12 is a simplified cross-sectional view of the semiconductor substrate of FIG. 11, during a further stage of fabricating a thyristor-based semiconductor memory device consistent with certain embodiments of the present invention, showing a second patterned photoresist to assist implanting source/drain extension regions for MOSFET-based access/peripheral devices.

In another embodiment of the present invention, referencing FIGS. 10–17, a method 1000 of fabricating a thyristor-based memory device may again comprise preliminary procedures of front-end CMOS processes (block 1010 of FIG. 10). These front-end CMOS procedures, similarly as described earlier relative to FIGS. 5–6, may include provisions for SOI substrate 225, formation of isolation trenches for defining different active regions of silicon layer 220, formation of gate oxides and first wordline electrodes 252 over body regions for access transistors to access the thyristors, formation of second wordline electrodes 250 with insulating dielectric between second wordline electrode 250 and silicon layer 220, and gate electrodes to other peripheral CMOS logic devices.

In this example, the front-end CMOS procedures (block 1010 of FIG. 10) may include formation of, e.g., cathode emitter extension regions 1158 for the thyristors in the mirror-image pair (FIG. 11) as defined by photoresist mask 1110. The photoresist 1110 may be layered and patterned over substrate 225 to protect transistor regions around gate electrodes, first wordline electrodes 252 and a portion of second wordline electrodes 250. The implanted regions may be self-aligned to the preliminary spacers 247 against the outer sidewalls of second wordline electrodes 250 to respective thyristors of the thyristor pair and to a sidewall of the photoresist 1110 between the first and second wordline electrodes. Photoresist 1110 may be removed after the implant of the cathode-emitter extension regions 1158.

The front-end CMOS procedures (block 1010 of FIG. 10) may further include the formation of lightly-doped drain/source (LDD) extension regions 1258 (FIG. 12) about gate electrodes 252 to respective CMOS transistors. It may also include halo implants proximate the boundaries of the source/drain regions of the CMOS devices and body regions. In this specific example, photoresist 1210 may be patterned over substrate 225 to protect the thyristor regions associated with second wordline electrodes 250 from ion bombardment during the implant for the source/drain extension regions 1258. In certain embodiments, the source/drain extension regions 1258 may be formed to partially overlap the cathode-emitter extension regions 1158 per a light dosage of about $1-2 \times 10^{13}$ atoms/cm$^2$. Photoresist 1210 may be removed after the implant of the extension regions 1258.

Figure 13:
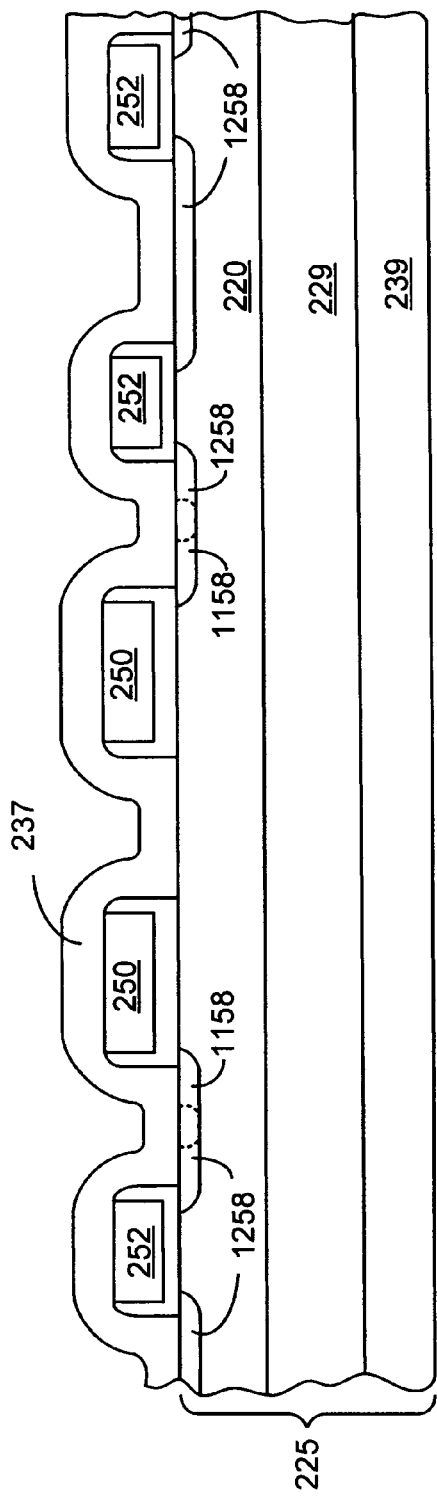
FIG. 13 is a simplified cross-sectional view of the semiconductor substrate of FIG. 12, during a further stage of fabricating a thyristor-based semiconductor memory device consistent with certain embodiments of the present invention, showing a conformal layer of dielectric deposed over semiconductor substrate.
Figure 14:
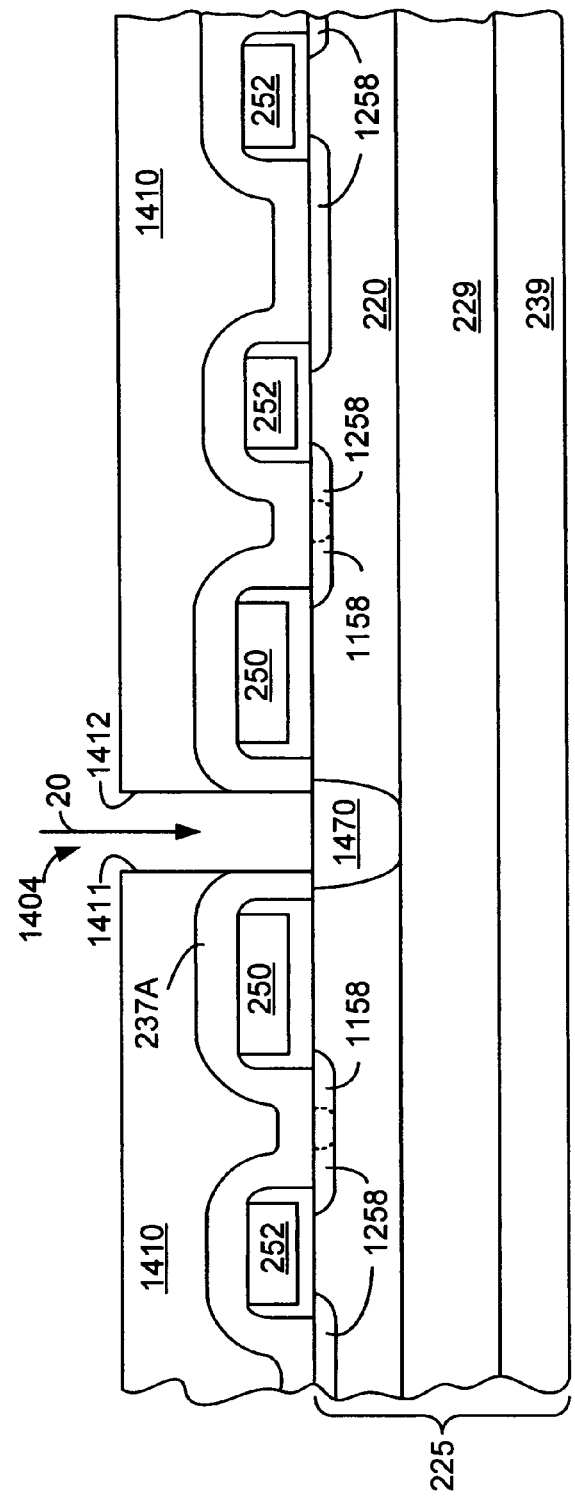
FIG. 14 is a simplified cross-sectional view of the semiconductor substrate of FIG. 13, during a further stage of fabricating a thyristor-based semiconductor memory device consistent with certain embodiments of the present invention, showing a patterned mask comprising a third photoresist over the dielectric to assist implant of a commonly implanted base region for the thyristors in mirror-image pair.

Referencing FIGS. 10 and 13–14, dielectric 237 may be conformally deposited over entire substrate 225 including regions with first and second wordline electrodes 250, 252 (FIG. 13). New photoresist 1410 may then be layered (block 1020 of FIG. 10) over the substrate and over first and second wordlines 250, 252 and over dielectric 237. The photoresist 1410 may be patterned (block 1020 of FIG. 10) to form a window therethrough with left and right sidewalls 1411, 1412 that define a width 1404 to a first window. The first window may be formed substantially centered between the neighboring capacitor (second wordline) electrodes 250 to respective left and right thyristors of the mirror-image pair. Further, the width for the opening may be defined to correspond to the desired lateral extent for base region 1470 to be commonly implanted into the layer of silicon 220.

Using the patterned photoresist 1410 as an etch mask, the exposed regions of dielectric 237 may then be anisotropically etched to further form (block 1020 of FIG. 10) the sidewalls in the masking material for defining the window by which to implant base region 1470 for the left and right thyristors. The etch may form shoulders from the dielectric adjacent to the neighboring second wordline electrodes 250 and extending laterally inward toward the common emitter region. In this case, the shoulders may be formed with a length sufficient to laterally offset the base regions relative the edges (inwardly facing) of the neighboring capacitor (second wordline) electrodes 250 to the mirror-image pair. This lateral extent for the dielectric shoulders may be formed with a length less than that as was defined for the embodiment described before with reference to FIGS. 5 and 6.

Moving forward with further reference to FIGS. 10 and 14, N-type (first type) dopant may then be implanted (block 1030 of FIG. 10) into the exposed regions of silicon as defined by the window of the patterned masking material comprising photoresist 1410 and dielectric 237. In a particular embodiment, phosphorous may be directed toward the masked substrate using an angle of incidence of about ±4 degrees to ±15 degrees from the normal, energy of about 60 keV and dosage of about $4 \times 10^{14}$ (twisted) ions/cm$^2$.

In a particular embodiment, referencing FIG. 15, after commonly implanting the base regions 1470 for the left and right thyristors of the mirror-image pair, photoresist 1410 may be removed from substrate 225 and new photoresist 1510 layered and patterned to cover and protect the substrate material between the second wordline electrodes and portions of dielectric 237 overlapping and covering the inwardly facing shoulders of second wordline electrodes 250. Using the newly patterned photoresist 1510 as an etch mask, resulting dielectric 237 may partially cover shoulder regions of second wordline electrodes 250.

This specific example may include, therefore, as a part of the front-end processing, the formation of the spacers 247, 1547 against the sidewalls of the gate electrodes (including first wordline electrode 252) for MOSFET devices to define source and drain regions 1577 within silicon layer 220 that are to receive deep source/drain implants.

Next, photoresist 1510 may be removed and the width of the window defined by the patterned dielectric mask material(s) may be further narrowed (block 1035 of FIG. 10). In one embodiment, referencing FIGS. 10, 16 and 17, a second new conformal layer of dielectric may be conformally deposited, and anisotropically etched over substrate 225 (including the previously patterned spacer dielectric 1547) to form spacers 1647A, 1647B against the previously defined dielectric shoulders 237A, 237B.

In this examplary embodiment, the conformal layer of dielectric may be formed with a thickness of about 20 nm to 200 nm. When etched anisotropically, the addition of spacers 1647A, 1647B against the patterned dielectric shoulders 237A, 237B may be understood to reduce the width of window 1404 for masking by about 20 nm to 200 nm as related to the originally layered thickness of the second conformally deposited dielectric. It may be noted further that the width of the mask window defined by substantially identical spacers 1647A, 1647B may thus be reduced by substantially equal amounts at each of the left and right sidewalls.

Figure 17:
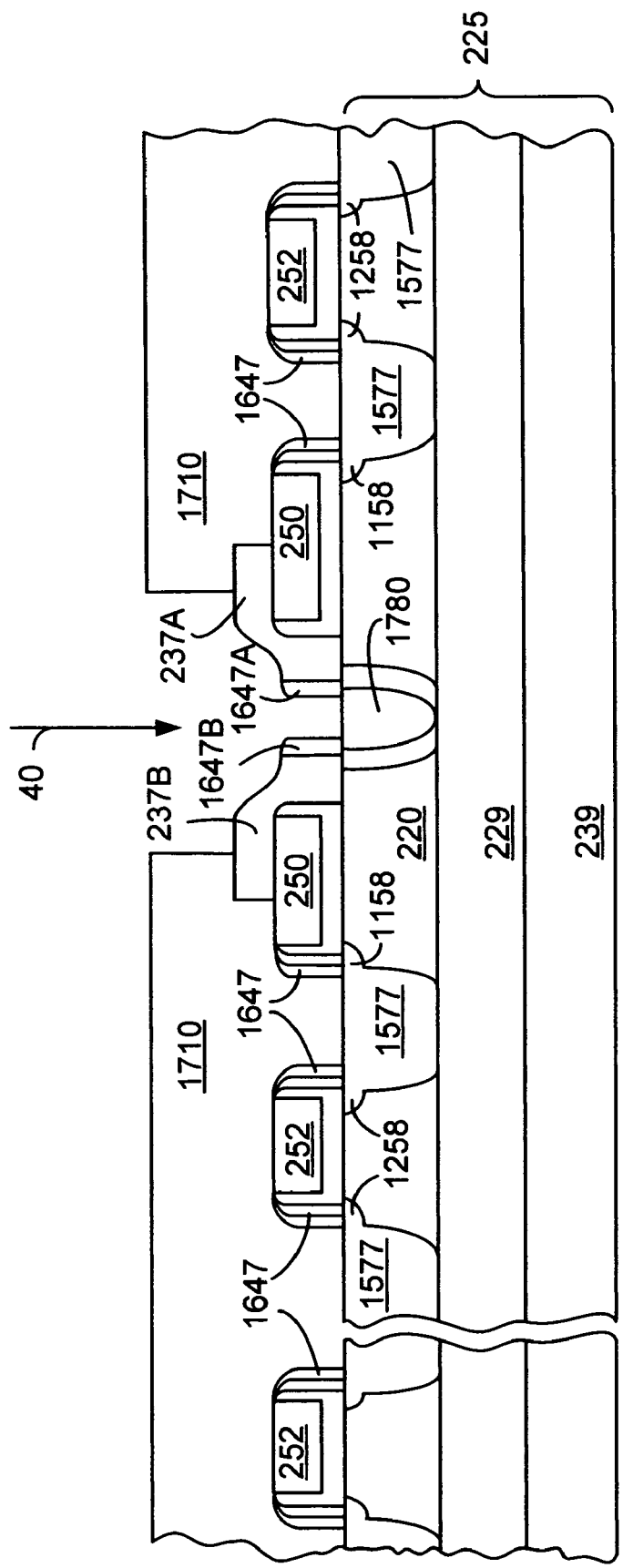
FIG. 17 is a simplified cross-sectional view of the semiconductor substrate of FIG. 16, during a further stage of fabricating a thyristor-based semiconductor memory device, showing the implant of a common emitter region for the thyristors in mirror-image pair, the common emitter being formed laterally and symmetrically within the commonly implanted base region aligned dependent on the sidewalls for the narrowed window.

Moving forward with reference to FIG. 17, a new photoresist 1710 may be layered and patterned over substrate 225 to protect the implanted source drain regions and regions associated with first wordline electrodes 252. The patterning of photoresist 1710 may leave a portion of the previously defined dielectric shoulders 237A, 237B exposed. Further referencing FIGS. 10 and 17, after reducing the width of window 1404 defined by the masking material comprising dielectric shoulders 237A, 237B and spacers 1647A, 1647B, p-type dopant (second type opposite to the first) may be implanted (block 1040 of FIG. 10) into the exposed regions of the silicon as defined by the mask of reduced window width. In one embodiment, p-type dopant implant 40 for the common emitter region 1780 may use boron, with implant energy of about 9 keV, an implant angle of about ±4 degrees to ±15 degrees relative to the normal, and dosage of at least about $3\times10^{15}$ ions/cm$^2$, twisted. It may be noted that this common emitter region 1780 is formed in overlapping relationship within the previously formed commonly implanted base region 1470, and substantially symmetrically therein as aligned dependent on the sidewalls of the narrowed window defined by dielectric shoulders 237A, 237B and spacers 1647A, 1647B.

Accordingly, a width for the N-base regions to respective left and right thyristors of the mirror-image pair may each be defined by the difference of respective left and right extents of the commonly implanted base region relative to the implanted common emitter region; which, in turn, may be related to the amount by which the respective sidewalls of the window in the masking material had been adjusted.

In a particular example, base region in silicon 220 for the left thyristor of the mirror-image pair may comprise a width of about 20 nm to 200 nm. This width for the N-base of the left thyristor may be understood to be substantially equal to that for the N-base of the right thyristor of the mirror-image pair. In certain embodiments, the term "substantially equal" may represent a variation in magnitudes between the widths of the left base region and the right base region of less than about 10 percent. In further examples, the left and the right thyristors of the mirror-image pair may be characterized as being substantially equivalent by way of their electrical properties.

Figure 18A:
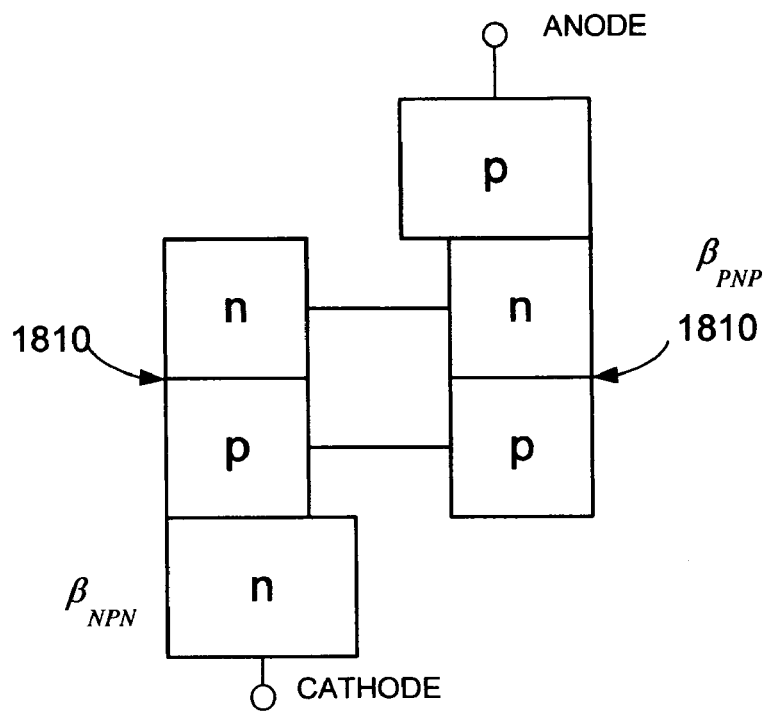
FIG. 18A is a simplified schematic diagram of a thyristor.
Figure 18B:
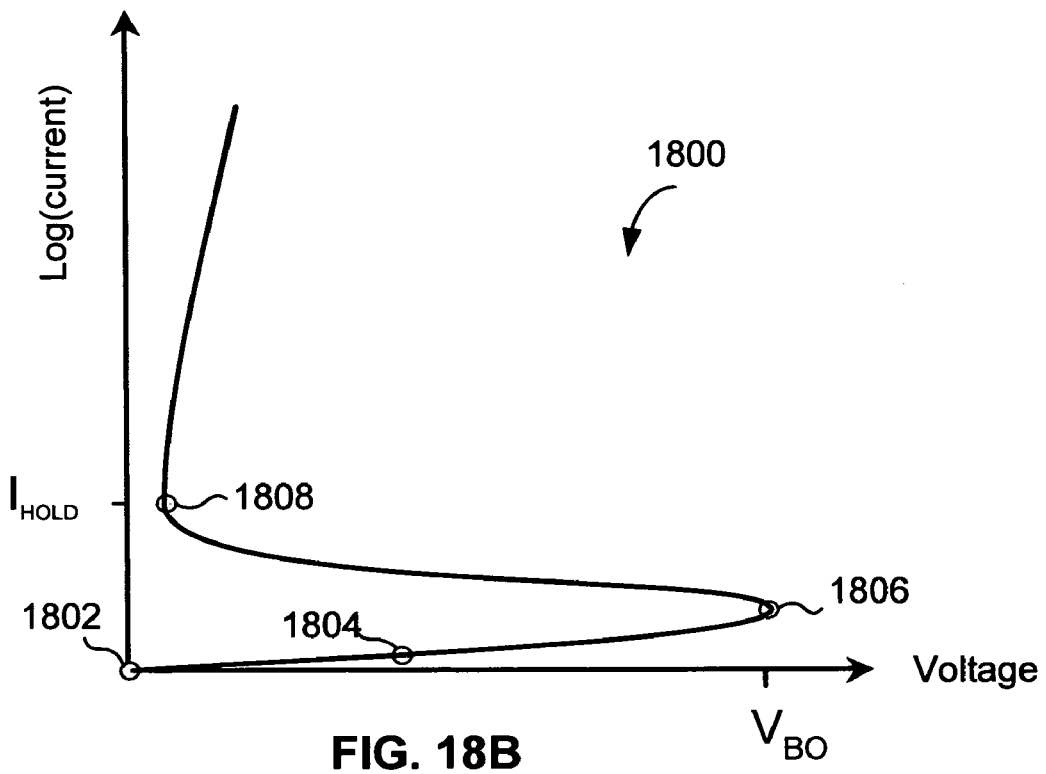
FIG. 18B is a graph illustrating a simplified current-voltage (i-v) characteristic for a thyristor-based device, useful for gaining an understanding of certain embodiments of the present invention.

FIGS. 18A–B simplistically illustrate the pn-junctions and current-voltage characteristics of a thyristor-based memory device (e.g., device 201/202), as may be useful for gaining an understanding of some embodiments of the present invention. When applying a voltage to the anode, the thyristor may initially resist current flow to sustain a non-conductive state, as represented by the thyristor's current-voltage characteristic curve 1800 between its off-state bias 1802 and bias point 1804 less than the break-over voltage. In this off state condition, the majority of the applied voltage appears across a reversed-biased pn-junction 1810. A current flowing through the thyristor may increase slowly corresponding to increases of the applied voltage up to knee point 1806, at which bias point voltage may start decreasing. The voltage level at the knee point may be known as a break-over voltage ($V_{BO}$). Beyond this first knee, the current level may increase abruptly as the voltage sharply decreases until the current reaches a second knee in the curve at bias point 1808. At this bias point, the thyristor may be described as having switched to an on-state condition. At and beyond switching point 1808, increases in voltage may result in increases in current. The magnitude of current required to keep the thyristor in the on-state condition at the second knee near switching point 1808 may be referred to as the minimum holding current ($I_{Hold}$) at room temperature. Depending on the particular thyristor device embodiments, the minimum holding current may be as large as 10 micro-amps or as low as 10 pico-amps.

Each of the left and right thyristors may be specified with a given minimum hold current ($I_{Hold}$). This minimum holding current, in turn, may be understood to be dependent on the current gain of the respective thyristors—i.e., $\beta_{NPN}*\beta_{PNP}$—as defined by the combined gain of the consistent NPN and PNP bipolar devices. Referencing FIG. 18A, the current gain ($\beta_{NPN}$) of the bipolar device (NPN) associated with the base region (e.g., p-base per the previously described example) that is capacitively coupled to capacitor electrode 250 may be understood to be reasonably consistent between the left and right thyristor devices. In contrast, the current gain ($\beta_{PNP}$) of the other bipolar device (PNP) associated with the base of a narrow width (N-base), this bipolar device may be understood to experience a gain dependent upon the consistency by which dopant concentration and width therefor may be produced.

Consistent with some embodiments of the present invention, the magnitude of the width of a base region for one of the two mirror-image thyristors may be substantially equal to that for another of the two mirror-image thyristors; e.g., the differences in the magnitudes between the two widths may be substantially reduced and controlled within half of a decade. For further embodiments of such symmetrical fabrication, the differences between magnitudes of their minimum holding current ($I_{Hold}$) of the two mirror-imaged thyristors may similarly be reduced. In particular embodiments, the magnitude of $I_{Hold}$ for the left thyristor may be substantially identical to that of the right thyristor, i.e., within 10 percent.

For example, if the right thyristor of the mirror-image pair has a minimum holding current ($I_{Hold}$) of 100 nA, then the left thyristor will have a similar minimum holding current of 100 nA±10 nA.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments. It may be further understood that such modifications and changes might not depart from the true spirit and scope of the present invention as may be set forth in the following claims.

What is claimed is:

1. A method of fabricating a semiconductor device, comprising:
   forming sidewalls in masking material over semiconductor material to define a window;
   conditioning the masking material over the semiconductor material;
   implanting first-type dopant in the semiconductor material for a base region to each of first and second thyristors for a mirror image pair, the implanting affecting substantially identical lateral extents to the base regions in the semiconductor material relative to the sidewalls of the conditioned masking material; and
   implanting second-type dopant into regions of the semiconductor material aligned to the sidewalls defining the window, and forming an emitter region for the thyristors with a lateral extent less than that for the base regions and substantially symmetrically therein;
   in which:
   the implanting with the first-type dopant for the base regions comprises directing the first type dopant toward the semiconductor material per an angle of incidence relative to a plane defined by a surface of the semiconductor material per an acute angle of incidence that is less than 60 degrees; and
   the implanting with the second-type dopant for the emitter region comprises directing the second-type dopant toward the semiconductor material using an angle of incidence of 75 to 105 degrees relative to the plane.

2. The method of claim 1, in which the implanting with the first-type dopant extends some of the first-type dopant laterally within the semiconductor material to regions beneath and beyond a peripheral edge of the window defined by the sidewalls of the masking material.

3. The method of claim 1, in which the implanting with the first-type dopant comprises:
performing a first portion of the implanting per the acute angle of incidence and forming a boundary to the base region in the semiconductor material for the first thyristor, the boundary to the base region for the first thyristor formed in alignment beneath and laterally beyond a first wall of the sidewalls that define the mask window; and
rotating a direction of incidence for the implanting of the first-type dopant about an axis substantially normal to the plane defined by the surface of the substrate; and
performing a second portion to the implanting per the acute angle of incidence and forming a boundary to the base region of the second thyristor in the semiconductor material, the boundary to the base region for the second thyristor formed in alignment beneath and laterally beyond a second wall of the sidewalls that define the mask window, the second wall substantially opposite the first wall across the window.

4. A method of fabricating a semiconductor device, comprising:
forming sidewalls in masking material over semiconductor material to define a window;
conditioning the masking material over the semiconductor material;
implanting first-type dopant in the semiconductor material for a base region to each of first and second thyristors for a mirror image pair, the implanting affecting substantially identical lateral extents to the base regions in the semiconductor material relative to the sidewalls of the conditioned masking material;
layering photoresist over the semiconductor material; and
patterning the photoresist and forming an opening therethrough as at least a part of the forming the sidewalls in the masking material;
in which the conditioning comprises hardening the photoresist to influence its durability to ion bombardment.

5. A method of fabricating a semiconductor device, comprising:
forming sidewalls in masking material over semiconductor material to define a window;
conditioning the masking material over the semiconductor material;
implanting first-type dopant in the semiconductor material for a base region to each of first and second thyristors for a mirror image pair, the implanting affecting substantially identical lateral extents to the base regions in the semiconductor material relative to the sidewalls of the conditioned masking material;
layering photoresist over the semiconductor material; and
patterning the photoresist and forming an opening therethrough as at least a part of the forming the sidewalls in the masking material;
in which the conditioning comprises performing an extended bake for the photoresist.

6. The method of claim 5, in which the bake of the conditioning is performed after the patterning of the photoresist defining the opening therethrough.

7. The method of claim 6, in which the conditioning comprises exposing the photoresist to a temperature environment of at least 90 degrees Celsius and less than 250 degrees Celsius.

8. The method of claim 7, in which the photoresist processing uses a UV bake and a temperature during the conditioning less than about 170 degrees Celsius.

9. The method of claim 7, in which the conditioning further comprises bombarding the photoresist over the semiconductor material with neutral species.

10. The method of claim 9, in which the bombarding with neutral species uses at least one element of the group consisting of carbon, silicon, germanium, hydrogen, halogen and noble gas.

11. The method of claim 10, in which the bombardment with neutral species is performed after the patterning of the photoresist.

12. The method of claim 11, in which:
the forming the sidewalls further comprises etching exposed regions of dielectric as defined by the patterned photoresist and extending the sidewalls for increasing a depth of the window into the dielectric; and
the conditioning is performed after the etching of the dielectric.

13. The method of claim 12, in which:
the etching of the dielectric is continued until exposing regions of the semiconductor material; and
the bombardment with the ions of the neutral species includes bombardment of regions of the semiconductor material exposed by the window.

14. The method of claim 4, in which the conditioning comprises striking the photoresist with neutral species.

15. The method of claim 14, in which the neutral species comprises at least one element of the group consisting of carbon, silicon, germanium, hydrogen, halogen and noble gas.

16. The method of claim 4, in which the implanting of the first-type dopants for the base regions comprises:
during a first portion of the implanting, directing ions of the first-type dopant toward the semiconductor material using a first direction of incidence and implanting the base region for the first thyristor aligned to and located laterally beneath a first wall of the window; and
during a second portion of the implanting, directing ions of the first-type dopant toward the semiconductor material using a second direction of incidence and implanting the base region for the second thyristor aligned to and located laterally beneath a second wall of the window, the second wall opposite to the first wall across the opening.

17. The method of claim 16, further comprising:
rotating the semiconductor material with the masking material patterned thereover about a rotational axis orthogonal to a plane defined by a surface of the semiconductor material; and
performing the rotating between the implanting using the first direction of incidence and the implanting using the second direction of incidence.

18. The method of claim 17, in which:
the semiconductor material defines as least part of a wafer;
the rotating comprises angularly rotating the wafer through an angular rotation of about 180 degrees; and the implanting with the second direction of incidence comprises forming the base region for the second thyristor as a substantially mirror image equivalent to that for the first thyristor.

19. The method of claim 18, in which the first and second directions of incidence each define an acute angle of incidence of less than 60 degrees relative to the plane defined by the surface of the semiconductor material and substantially parallel to the wafer.

20. The method of claim 18, in which the implanting uses an angle of incidence for the first and the second directions of incidence of between about 40 to 60 degrees relative to a horizontal as defined by the wafer.

21. A method of fabricating a thyristor-based semiconductor memory device comprising:
forming masking material over semiconductor material;
forming sidewalls in the masking material to define a window therethrough; and
implanting first-type dopant to form a base region to a left thyristor in the semiconductor material aligned relative to a left wall of the sidewalls that define the window and to form a base region to a right thyristor in the semiconductor material aligned relative to a right wall of the sidewalls defining the window, the base region to the right thyristor formed for substantial mirror-image relationship relative to the base region for the left thyristor;
modifying the sidewalls defined by the masking material to narrow a width of the window between the left and right walls; and
implanting second-type dopant for an emitter region in the semiconductor material to be in common for each of the left and the right thyristors, the implanting with second-type dopant aligned relative to the modified sidewalls for the narrowed window;
in which
the amount by which the right sidewall is modified for the narrowing of the window defines in part the width for the base region to the right thyristor;
the amount by which the left sidewall is modified for the narrowing of the window defines in part the width for the base region to the left thyristor; and
the magnitude by which the modified right sidewall narrows the window being within 10% of that by which the modified left sidewall narrows the window.

22. The method of claim 21, in which the modifying of the sidewalls narrows the opening defined by the mask window by a magnitude of 20 to 200 nm.

23. A method of fabricating a thyristor-based semiconductor memory device comprising:
forming masking material over semiconductor material, comprising forming dielectric conformally over the semiconductor material and over a plurality of first wordline electrodes and a plurality of second wordline electrodes, forming photoresist over the dielectric, and using the etched dielectric during the implanting of the first-type dopant;
forming sidewalls in the masking material to define a window therethrough; and
implanting first-type dopant to form a base region to a left thyristor in the semiconductor material aligned relative to a left wall of the sidewalls that define the window and to form a base region to a right thyristor in the semiconductor material aligned relative to a right wall of the sidewalls defining the window, the base region to the right thyristor formed for substantial mirror-image relationship relative to the base region for the left thyristor;
modifying the sidewalls defined by the masking material to narrow a width of the window between the left and right walls; and
implanting second-type dopant for an emitter region in the semiconductor material to be in common for each of the left and the right thyristors, the implanting with second-type dopant aligned relative to the modified sidewalls for the narrowed window;
in which the forming the sidewalls comprises patterning the photoresist to form an opening therethrough and expose a region of the dielectric, etching the region of the dielectric exposed by the opening through the photoresist opening and forming at least a portion of the sidewalls for the window through the masking material, and using the etched dielectric as at least a portion of an/the hard mask during the implanting of the first type dopant;
in which the modifying the sidewalls and narrowing the window comprise forming spacers against the portion of the sidewalls defined by the dielectric;
in which the plurality of the first wordline electrodes to be formed as gates to access transistors by which to access respective ones of the left and the right thyristors, and the second wordlines to be formed to capacitively couple to the p-base regions of the respective ones of the left and the right thyristors;
in which the patterning of the photoresist to comprise forming the window to expose regions of the dielectric disposed laterally between neighboring ones of the second wordlines as are to be associated with respective left and right thyristors of the mirror-imaged pairs; and
in which the modifying the sidewalls further comprises removing the patterned photoresist, depositing second dielectric conformal to the exposed regions of the semiconductor material and against the edges of the etched dielectric, and anisotropically etching the conformally deposited second dielectric to define spacers therefrom against the edges of the dielectric.

24. The method of claim 23, further comprising:
forming second photoresist over the semiconductor material and the first and the second wordline electrodes; and
patterning the second photoresist and defining an opening therethrough to be at least as wide and to be encompassing of the edges of the etched dielectric.

25. The method of claim 24, further comprising performing the second photoresist formation after modifying the sidewalls and before the implanting of the second-type dopant for the anode-emitter region.

26. The method of claim 23, further comprising:
using an angle of incidence of 75 to 115 degrees relative to the horizontal for ions of the first-type dopant directed toward the semiconductor material during the implanting for the base regions; and
using an angle of incidence of 75 to 115 degrees relative to the horizontal for ions of the second-type dopant directed toward the semiconductor material during the implanting for the emitter region.

27. The method of claim 26, in which the substantially perpendicular angle of incidence is within ±15 degrees of normal.

28. The method of claim 26, in which the first-type dopant comprises N-type and the second-type dopant comprises P-type; the method further comprising:
- forming further windows in photoresist over the semiconductor material;
- using the further windows and implanting with the first-type dopant to form source and drain regions to N-MOS devices as defined at least in part by the further windows in the photoresist for CMOS logic devices in peripheral regions of the semiconductor material away from the regions for the thyristors; and
- forming further windows in additional photoresist over the semiconductor material; and
- using the further windows in the additional photoresist and implanting with the second-type dopant to form source and drain regions to P-MOS devices as defined at least in part by the further windows in the additional photoresist for the CMOS logic devices in the peripheral regions of the semiconductor material.

29. The method of claim 28, in which:
- the depositing of second dielectric and the anisotropically etching thereof to further form spacers against gate electrodes to the P-MOS devices in the peripheral regions; and
- the implanting for the source and the drain regions for the P-MOS devices to be aligned relative to the spacers formed against the gate electrodes therefor.

30. The method of claim 21, further comprising exposing the masked-semiconductor material to temperatures of at least 90 degrees Celsius.

31. The method of claim 30, in which the exposing uses temperature up to 250 degrees Celsius.

32. The method of claim 31, further comprising performing the exposing to temperature after the etching of the exposed dielectric.

33. The method of claim 32, further comprising bombarding the masked semiconductor material with at least one element of the group consisting of carbon, silicon, germanium, hydrogen, halogen and noble gas.

34. A method of fabricating a thyristor-based semiconductor memory device comprising:
- forming masking material over semiconductor material;
- forming sidewalls in the masking material to define a window therethrough; and
- implanting first-type dopant to form a base region to a left thyristor in the semiconductor material aligned relative to a left wall of the sidewalls that define the window and to form a base region to a right thyristor in the semiconductor material aligned relative to a right wall of the sidewalls defining the window, the base region to the right thyristor formed for substantial mirror-image relationship relative to the base region for the left thyristor;
- modifying the sidewalls defined by the masking material to narrow a width of the window between the left and right walls; and
- implanting second-type dopant for an emitter region in the semiconductor material to be in common for each of the left and right thyristors, the implanting with second-type dopant aligned relative to the modified sidewalls for the narrowed window;
- in which the window is defined in the masking material with a width as great as the thickness of the masking material.

35. The method of claim 34, in which the width of the window is narrowed substantially symmetrically per the opposite left-to-right sidewalls of the masking material that define the window.

* * * * *